(12) United States Patent
Comer et al.

(10) Patent No.: US 6,943,626 B2
(45) Date of Patent: Sep. 13, 2005

(54) WIDEBAND PRECISION FIXED-GAIN AMPLIFIER ARCHITECTURE, APPARATUS, AND METHOD

(76) Inventors: Donald T. Comer, 1631 N. 1000, West Mapleton, UT (US) 84664; Brent R. Carlton, 1180 SE. 38th Ave., Hillsboro, OR (US) 97124

( * ) Notice: Subject to any disclaimer, the term of this patent is extended or adjusted under 35 U.S.C. 154(b) by 31 days.

(21) Appl. No.: 10/741,642

(22) Filed: Dec. 19, 2003

(65) Prior Publication Data

US 2004/0130393 A1 Jul. 8, 2004

Related U.S. Application Data

(60) Provisional application No. 60/435,122, filed on Dec. 19, 2002.

(51) Int. Cl.[7] ................................................ H03G 5/16
(52) U.S. Cl. .................... 330/133; 330/310; 330/129
(58) Field of Search ........................... 330/133, 310, 330/129

(56) References Cited

U.S. PATENT DOCUMENTS

| | | | | |
|---|---|---|---|---|
| 4,506,232 A | * | 3/1985 | Thompson | ................ 331/16 |
| 5,572,166 A | * | 11/1996 | Gilbert | ..................... 330/254 |
| 5,635,871 A | * | 6/1997 | Cavigelli | .................. 330/107 |
| 6,011,437 A | * | 1/2000 | Sutardja et al. | ............ 330/254 |
| 6,208,206 B1 | * | 3/2001 | Leung et al. | ............... 330/107 |
| 6,275,104 B1 | * | 8/2001 | Holter | ....................... 330/149 |

* cited by examiner

Primary Examiner—Patricia Nguyen
(74) Attorney, Agent, or Firm—Kunzler & Associates

(57) ABSTRACT

An apparatus and method is disclosed for improving the gain precision and bandwidth of fixed-gain amplifiers, while providing high bandwidth and performance necessary in many applications. Fixed-gain amplifiers, having relatively precise gain, are connected together in a specific architecture to further increase the gain precision and bandwidth over any of the amplifiers operating independently. Due to the configuration of the amplifiers, the absolute gain error of individual amplifiers is substantially canceled such the gain error of the total circuit is greatly reduced. The disclose architecture is useful in many high speed, high bandwidth applications where very precise gain is needed, while avoiding the reduction in bandwidth caused by amplifiers using feedback to achieve gain stability.

24 Claims, 4 Drawing Sheets

$62 \rightarrow V_O = (A_3 + e_3) * (V_I - Vx)$     $68 \rightarrow V_X = (A_2 + e_2) * (VY - VI)$
$74 \rightarrow V_Y = (A_1 + e_1) * VI$     $V_X = (A_2 + e_2) * (A_1 + e_1 - 1) VI$
$80 \rightarrow V_X = (A_2 A_1 + A_2 e_1 - A_2 + e_2 A_1 + e_2 e1 - e_1) VI$ $84 \rightarrow V_O = (A_3 + e_3) * (1 - A_2 A_1 - e_1 A_2 + A_2 - e_2 A_1 - e_2 e_1 + e_1) V_I$ assuming $A_3 = A_2 = A_1 = 1$ then $V_O = (1 - 1 - e_1 + 1 - e_2 - e_1 e_2 + e_1 + e_3 - e_3 - e_1 e_3 + e_3 - e_3 e_2 - e_1 e_2 e_3 + e_1 e_3) V_I$ and $90 \rightarrow G = \dfrac{V_O}{V_I} = 1 + e_3 - e_2 - e_1 e_2 - e_2 e_3 - e_1 e_2 e_3$
      $88$
assuming $e_3 = e_2 = e_1 = e$ then $92 \rightarrow G = 1 - 2e^2 - e^3$
      $88$

WIDEBAND PRECISION FIXED-GAIN AMPLIFIER ARCHITECTURE, APPARATUS, AND METHOD

RELATED APPLICATIONS

This application is a Continuation of and claims priority to U.S. Provisional Patent Application Ser. No. 60/435,122, filed on Dec. 19, 2002.

BACKGROUND OF THE INVENTION

1. The Field of the Invention

The invention relates to devices, methods, and systems for signal amplification. Specifically, the invention relates to devices, methods, and systems for improving the gain precision and bandwidth of fixed-gain amplifiers.

2. The Relevant Art

During the previous century, the design and use of a myriad of electronic circuits has provided numerous time-saving technological advances to society. Communications, once painstakingly slow, now traverse vast distances at the touch of a button. Other laborious tasks are now performed, controlled, and monitored by machines and computers. Many of the complex machines and circuits used to perform these tasks are constructed of relatively simple building blocks or components. Of these components, one of the most basic and useful building blocks is the amplifier.

As electronic circuits and amplifiers continue to advance, there is a continual push for higher bandwidth and system capacity. In various applications, amplifiers with precisely specified gains and having very wide bandwidths are valuable building blocks. Applications, such as signal processing, active filter circuits, audio-to-digital converters, multi-level modulation, folding amplifiers, voltage buffers, and the like, require the use of wideband, precision, fixed-gain amplifiers to perform precision summing of analog signals and other functions.

Previously, the use of operational amplifiers in conjunction with negative feedback has been a standard approach to achieve stable amplifier gain despite changes in time, temperature, or other process variations. However, using negative feedback to increase amplifier stability can also result in degraded performance and bandwidth of the amplifier.

Many applications do not require excessive bandwidth, and therefore, conventional operational amplifier circuits may be sufficient. However, many applications, particularly applications within emerging markets, do require higher bandwidth and performance in addition to a certain degree of precision. In these cases, amplifiers comprising operational amplifiers using negative feedback may not provide sufficient performance and bandwidth needed in these applications.

Without using negative feedback for gain stabilization, the open-loop gain of an operational amplifier may measure in the thousands. Although an open-loop amplifier may be faster and have better bandwidth characteristics, a gain of this magnitude may be far too high and unstable to be useful in many applications. Additionally, the input of the amplifier must be kept extremely small to keep the output somewhat linear and to avoid saturation.

In some cases, operational amplifiers may be designed to have improved fixed-gain accuracy at much lower gains without using compensatory circuitry required with negative feedback. For example, an amplifier may achieve gain accuracy by accurately matching selected internal components. However, even with improvements at lower gains in gain accuracy, bandwidth, and performance, an undesirably large gain error (e.g. deviation from an ideal gain value) may be present that is unacceptable for many high-speed applications.

What is needed is apparatus and methods for improving the gain accuracy of fixed-gain amplifiers.

What is further needed is apparatus and methods for connecting multiple fixed-gain amplifiers to further improve the gain accuracy of any of the amplifiers operating independently.

SUMMARY OF THE INVENTION

The various elements of the present invention have been developed in response to the present state of the art, and in particular, in response to the problems and needs in the art that have not yet been fully solved by currently available fixed-gain amplifiers. Accordingly, the present invention provides an improved apparatus, method, and system for improving the gain precision of fixed-gain amplifiers, while providing high bandwidth and performance necessary in many applications.

In one aspect of the present invention, an apparatus for providing precise gain using amplifiers having less precise gain includes a plurality of amplifiers, each amplifier thereof having a gain error that typically deviates from a desired gain value. Each of the plurality of amplifiers may be designed to provide an output signal that is proportional to a gain coefficient multiplied by a difference between a pair of input signals (e.g. a difference amplifier). In accordance with the invention, the plurality of amplifiers connected together may provide an overall gain error that is less than the gain error of each individual amplifier.

For example, in one embodiment in accordance with the invention, a plurality of amplifiers includes a first amplifier configured to provide a first output signal that is proportional to a difference between an input signal and a reference signal. The first amplifier may be connected to a second amplifier configured to provide a second output signal that is proportional to a difference between the output signal from the first amplifier, and the input signal. Likewise, a third amplifier may be configured to provide a third output signal that is proportional to a difference between the input signal and the second output signal, from the second amplifier. The third output signal is the overall device output signal. Due to the connection configuration of the first, second, and third amplifiers, the net gain error is improved above that of the first, second, and third amplifiers operating independently.

In certain embodiments, the plurality of amplifiers may be fixed-gain amplifiers of relatively high gain precision. Each of the amplifiers may be an open-loop amplifier, achieving a degree of gain precision using methods other than compensatory circuitry to achieve negative feedback. Thus, the amplifiers may be high speed and be able to support a very high bandwidth. In certain embodiments, the plurality of amplifiers may achieve gain accuracy by device matching, such as using a current mirror configuration. Because of the connection scheme of the amplifiers, if the plurality of amplifiers have substantially the same gain and gain error, the gain error of the apparatus as a whole may be substantially less than the gain error of each amplifier. For example, if the gain error of each individual amplifier is approximately 1%, then the gain error of the apparatus as a whole may be approximately 0.289%. This constitutes a very significant improvement.

If the amplifiers are again cascaded as hereinbefore described, the overall gain error may again be improved. For example, if the first, second, and third amplifiers described previously were treated as a single fixed-gain amplifier and arranged in a similar pattern as previously described, the overall gain error could be improved again by a factor similar to the first example.

In other embodiments, attenuators providing very accurate signal attenuation may be connected within the circuit to adjust the gain of the device to a desired fixed value.

In another aspect of the present invention, a method for providing precise gain using less precise amplifiers may include providing a plurality of amplifiers, each amplifier having a gain error. The method may further include providing an overall gain to an overall output signal that is proportional to a difference between an input signal and a reference signal, wherein an overall gain error is less than the gain error of each individual amplifier.

In certain embodiments, providing an overall gain that is less than the gain error of each individual amplifier may include producing a first output signal that is proportional to a difference between the input signal and the reference signal, producing a second output signal that is proportional to a difference between the first output signal and the input signal, and producing a third output signal that is proportional to a difference between the device input signal and the second output signal, wherein the third output signal is the overall output signal. In accordance with the invention, the first, second, and third output signals are achieved without using negative feedback.

In certain embodiments in accordance with the invention, the plurality of amplifiers may be fixed-gain amplifiers. In other embodiments, the plurality of amplifiers may be open-loop amplifiers that achieve gain accuracy by device matching, such as using a current mirror configuration. In accordance with the invention, the overall gain error achieved may be substantially less than the gain error of each individual amplifier.

If more amplifiers are cascaded in a similar configuration to that hereinbefore described, an overall gain error may be achieved that is again substantially improved. In other embodiments where other fixed gain values are desired, a method in accordance with the invention may include accurately attenuating specified signals such that a desired overall gain is achieved.

Various elements of the present invention are combined into a system for use in numerous applications, such as signal processing, active filter circuits, audio-to-digital converters, multi-level modulation, and the like, where applications require the use of wideband, precision, fixed-gain amplifiers to perform precision summing of analog signals and other functions.

The fixed-gain amplifier architecture described herein has characteristics that are similar to fixed-gain amplifiers implemented with operational amplifiers and feedback resistors. Apparatus and methods in accordance with the present invention also provide additional advantages of wide bandwidth, high performance, and simplicity. Thus, the means and methods disclosed herein are well suited to applications that require wideband operation and precise gains.

The various elements and aspects of the present invention provide a wideband, precision, fixed-gain amplifier architecture. The present invention increases achievable gain accuracy using fixed-gain amplifiers that are currently available. These and other features and advantages of the present invention will become more fully apparent from the following description and appended claims, or may be learned by the practice of the invention as set forth hereinafter.

BRIEF DESCRIPTION OF THE DRAWINGS

In order that the manner in which the advantages of the present invention are obtained will be readily understood, a more particular description of the invention briefly described above will be rendered by references to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
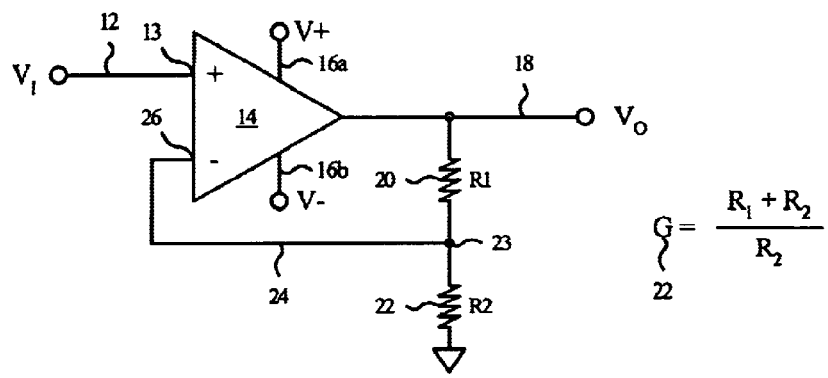
FIG. 1 is a schematic block diagram illustrating a typical prior art configuration of an operational amplifiers using negative feedback to stabilize the output gain.

Referring to FIG. 1, several undesirable characteristics are present in the prior art that the means and methods of the present invention address. Many of these unwanted characteristics are discussed in the background section of this specification. As discussed, a typical method of increasing the precision of an amplifier is using a high gain amplifier in conjunction with negative feedback. This method is commonly used to reduce the sensitivity of amplifier circuits to temperature drift and process variations. For example, the concept of feedback has been used to correct problems associated with temperature drift in telephone repeater amplifiers.

The use of negative feedback in an amplifier circuit may include various advantages. For example, the use of negative feedback may desensitize the gain to variations in component characteristics, improve amplifier linearity, reduce amplifier noise, control the input and output impedances of the amplifier, improve bandwidth characteristics compared to an amplifier's open loop bandwidth, and the like.

More specifically with respect to FIG. 1, an amplifier circuit 10 using negative feedback may include an operational amplifier 14 having a positive input 13, and a negative input 26, respectively. Ideally, the operational amplifier 14 may produce an output 18 proportional to a voltage difference between the inputs 13, 26. The ratio of the output 18 with respect to the difference of the inputs 13, 26, without compensatory circuitry, is referred to as the open loop gain. In many cases, the open loop gain of the amplifier 14 may be in the tens or even hundreds of thousands, far too large to be useful in many circuits. In addition, this enormous gain value may make any change in the difference between the inputs 13, 26 so sensitive that it may be nearly impossible to keep the output voltage 18 in a useful (e.g. linear) range, in a range between the voltage of the supply rails 16a, 16b, without some method of controlling the system 10.

Therefore, in order to exert more control over the system 10, and to provide a gain value having a more useful range, feedback may be used. Feedback may function to keep the differential input voltage (e.g. the voltage difference between inputs 13, 26) very small, in order to keep the output 18 in a linear range. In effect, this is accomplished by communicating between the negative input 26 and the output 18 of the operational amplifier 14 by way of a path 24. If the resistor 20 was deleted and the path 24 was connected directly to the path 18, the circuit would be what is commonly referred to as a simple voltage follower. In this example, the negative input 26 is connected directly to the output 18. The result is that after a time interval in which the circuit stabilizes, the output 18 of the operational amplifier 14 is forced to match the signal 12 presented at the positive input 13.

For example, in accordance with the function of an operational amplifier 14, if a voltage 12 from a signal source driving the positive input 13 were to go positive, causing the difference between the inputs 13, 26 to be positive, the output 18 of the operational amplifier 14 would start to go very positive due to the enormous gain of the amplifier 14. If the output 18 were connected directly to the negative input 26, the negative input 26 would also be forced to go positive. However, the negative input 26 will resist going more positive than the positive input 13 in order to prevent the output 18 from going negative. The result is that the negative input 26 will very closely approach the voltage of the positive input 13, thereby causing the output 18 to track the input 13.

In a similar manner, if a gain greater than one is desired, this may be accomplished by feeding back a voltage to the negative input 26, less than the output voltage 18. As illustrated in FIG. 1, the negative input 26 receives a voltage 23 at a point 23 after the output voltage 18 has been divided by a voltage dividing network 20, 22. In the illustrated embodiment, a dividing network 20, 22 reduces the voltage by R2/(R1+R2). As a result, the operational amplifier circuit 10 delivers an output 18 that is a multiple of the input 12. The gain 26 of the circuit 10 is calculated to be (R1+R2)R2. For example, if R1 is equal to 9 KOhm and R2 is equal to 1 KOhm, then the gain 26 of the circuit 10 would be 10. Thus, a 1 volt input at input 13 would result in a 10 volt output at output 18.

In many applications, amplifiers circuits 10 using feedback such as that illustrated are very helpful and sufficient for the specific requirements of the application. However, many applications require higher bandwidth and performance than is possible using conventional feedback amplifier circuits 10. Moreover, these applications may also require fixed-gain amplifiers with very precise gain, a characteristic that may be very difficult to achieve without using feedback. Thus, apparatus and methods are needed to provide signal amplification without requiring feedback, while still producing very precise gain and wideband operation.

Figure 8:
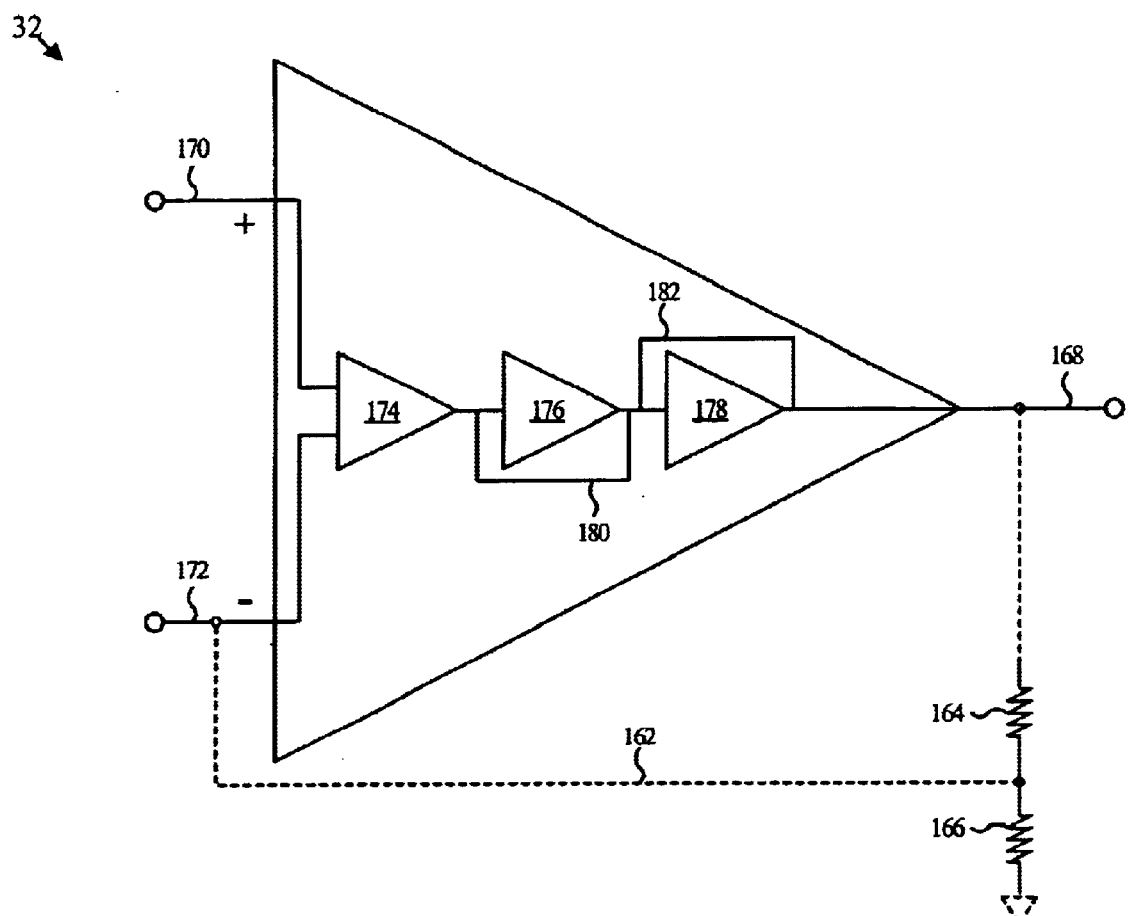

Published approaches to achieving high-bandwidth along with high precision gain include using open loop fixed-gain circuits that achieve their accuracy by device matching, such as using a current mirror configuration, using skewed feedback in conjunction with low loop gain, or using amplifiers with minor loop feedback, as described in FIG. 8. Both of these approaches can generally achieve precision within the range of 0.5% through 3%. However, these methods have difficulty realizing precision values close to 0.1%. Thus, in accordance with the invention, several "less precise" amplifiers (e.g. those operating within the range of 0.5% through 3%) may be connected together such that the overall gain achieved is more precise than any of the amplifiers operating independently.

Figure 2:
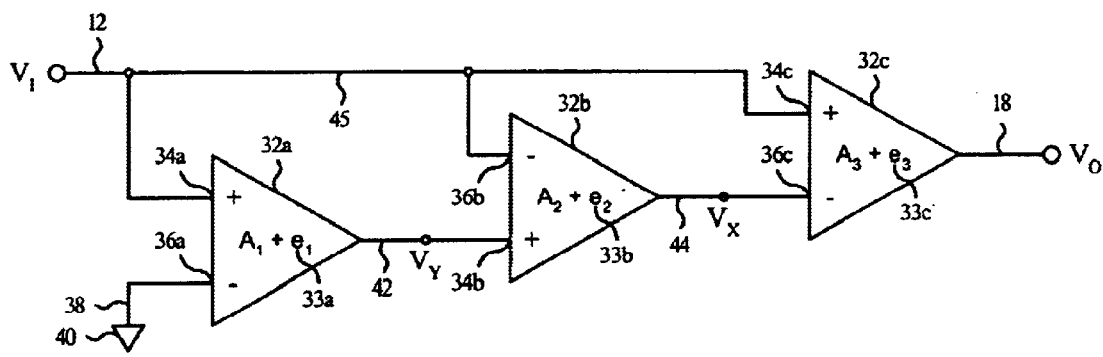
FIG. 2 is a schematic block diagram illustrating one embodiment wherein a group of amplifiers are arranged in a circuit in accordance with the present invention to improve the gain precision and bandwidth of the output.

For example, referring to FIG. 2, in one embodiment in accordance with the invention, a first differential amplifier 32a, such as an operational amplifier circuit 32a, may receive an input signal 12 at a first input 34a. The differential amplifier 32a may compare the signal 12 to a reference signal at a second input 36a and produce an output signal 42 proportional to the difference between the inputs 34a, 36a. The magnitude of the output signal 42 may be proportional to a rated gain value 33a plus or minus an error term 33a. The error term may lie substantially within the range of 0.5% through 3%, as mentioned previously.

In a like manner, a second differential amplifier 32b may receive the output 42 from the first differential amplifier 32a at a first input 34b. The second differential amplifier 32b may compare the signal 42 to the input signal 12 at a second input 36b. The second differential amplifier 32b may produce an output proportional to the difference between the inputs 34b, 36b, the magnitude of the output signal 44 being proportional to a rated gain value plus or minus an error term 33b.

Similarly, a third differential amplifier 32c may receive the output 44 from the second differential amplifier 32b at a first input 36c, and receive the input signal 12, 45, at a second output 34c, and produce an output signal 18 proportional to the difference between the inputs 34c, 36c. The magnitude of the output signal 18 may be proportional to a rated gain value 33c plus or minus an error term 33c.

In the depicted embodiment, the inputs 34a, 34b, and 34c are positive inputs, the inputs 36a, 36b, and 36c are negative inputs, the amplifiers 32 are connected in a cascaded arrangement with the input signal 12, 45 alternately connected to positive and negative inputs. Because of the unique interconnection topology of the amplifiers 32, the gain of the device 30 as a whole may have an error term that is less than the individual error terms 33. Although the device 30 is depicted with three cascaded amplifiers, the depicted interconnection topology may be applied to any number of amplifiers. The principles under which the gain of the device 30 provides an overall gain error that is less than the gain error of the individual amplifiers 32 will be discussed in further detail in the description of FIG. 4.

Figures 3, 4:
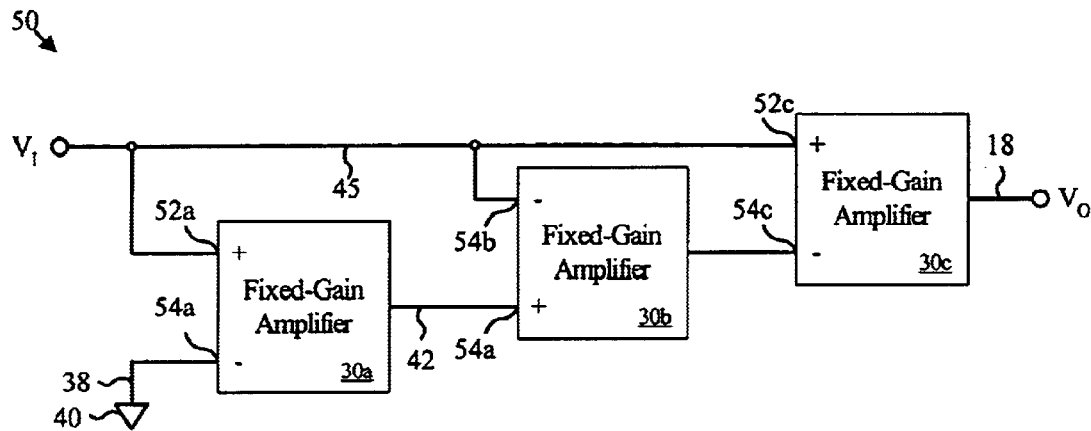
FIG. 3 is a schematic diagram illustrating one embodiment wherein the apparatus of FIG. 2 is further cascaded in accordance with the invention to further improve the gain precision of the output.
FIG. 4 is a flow chart illustrating one embodiment of the mathematic principles used in accordance with the present invention to improve the gain precision.

Referring to FIG. 3, the apparatus 30 described in FIG. 2 may be cascaded to further increase the precision of a fixed-gain amplifier. Thus, the precision of the fixed-gain amplifier 50 may exceed the precision of the amplifier 30.

For example, in one embodiment in accordance with the invention, a fixed-gain amplifier 30a consistent with that described in FIG. 2 may receive an input signal 12 at a first input 52a. The fixed-gain amplifier 30a may compare the signal 12 to a reference signal 38 at a second input 54a and produce an output signal 42 proportional to the difference between the inputs 52a, 54a. The magnitude of the output signal 42 may be proportional to the improved gain value produced by the amplifier 30a, plus or minus an improved error term.

Likewise, a second fixed-gain amplifier 30b may receive the output 42 from the first fixed-gain amplifier 30a at a first input 52b. The second fixed-gain amplifier 30b may compare the signal 42 to the input signal 12 at a second input 54b. The second fixed-gain amplifier 30b may produce an output 44 proportional to the difference between the inputs 52b, 54b, the magnitude of the output signal 44 being proportional to the improved gain value achieved by the device 30 described in FIG. 2.

Similarly, a third fixed-gain amplifier 30c may receive the output 44 from the second fixed-gain amplifier 30b at a first input 54c, and receive the input signal 12 at a second output 52c, and produce an output signal 18 proportional to the difference between the inputs 52c, 54c. The magnitude of the output signal 18 may be proportional to the improved gain value achieved by the device 30 of FIG. 2. The cascaded configuration of the amplifiers 30a, 30b, 30c, enables the gain of the device 50 to be more precise than that produced by the amplifier 30 of FIG. 2 alone.

Referring to FIG. 4, while continuing to refer generally to FIG. 2, due to the unique configuration of the amplifiers 32 the gain error of the device 30 as a whole may be less than that of any of the individual amplifiers 32. This may be illustrated by demonstrating one example of the mathematics or principles 60 under which the device 30 functions. Due to these principles, the error terms cancel out to create an overall error term that is smaller than any of the individual error terms.

For example, the voltage 18 ($V_o$) out of the device 30 may be represented by a first equation 62 and be substantially equal to a gain value ($A_3$) plus an error term ($e_3$) multiplied by a difference ($V_i - V_x$) of the voltage at the input terminals 34c, 36c. As was previously stated hereinbefore, in one example, the error term 64 ($e_1$) may substantially lie within the range of 0.5%–3.0% of the gain term ($A_3$).

Likewise, the output voltage 44 ($V_x$) from the differential amplifier 32b may be represented by an equation 68. The output voltage 44 may be substantially equal to a gain value $A_2$ plus an error term ($e_2$), multiplied by a difference in voltage ($V_y - V_i$) at the input terminals 34b, 36b. Similarly, a third equation 74 may be used to represent the output voltage 42 ($V_y$) from the differential amplifier 32a. The output voltage 44 may be substantially equal to a gain value $A_3$ plus or minus an error term ($e_3$), multiplied by a difference ($V_i$) of the voltage at the input terminals 34a, 36a. The difference 78 is represented by a single term 78 ($V_i$) since the term 78 is compared to a reference signal 40 which for the purposes of illustration is assumed to be tied to ground (i.e. zero volts).

The term ($V_y$) found in the equation 68 may be replaced by the expression found in the equation 74 to yield a new equation 80. Likewise, the expression found in the equation 80 may be substituted for the term ($V_x$) found in the equation 62 to yield a new equation 84 for ($V_o$). At this point, the overall gain value 88 (G) of the circuit 30 may be calculated by solving for ($V_o/V_i$), the output voltage 18 divided by the input voltage 12 as illustrated by the equation 86.

If the case is assumed where the gain values $A_3 = A_2 = A_1 = 1$, then it is possible to more easily see the relationship of the error terms. In this case, the result is the equation 90. Likewise, if it is assumed that the error terms are substantially equal, then the overall gain value 88 for the circuit 30 is represented by the equation 92. Although the amplifiers 32 may not exhibit identical characteristics, including fixed gain value and gain error, the devices 32 may be very similar and may have very similar characteristics. Thus, for the sake of simplicity, the equation 92 illustrates the increase in gain precision that may be possible using the amplifiers 32 as illustrated in the configuration of FIG. 2.

Upon examination of the equation 92, it is apparent that error terms become smaller since they are now squared or cubed. Because the error terms may be much less than one, this will have the effect of reducing the overall error significantly as compared to the error terms of the individual amplifiers 32. In certain embodiments, if the gain errors of the individual amplifiers 32 are not substantially equal (i.e. they do not track), the process 60 may not exhibit the gain improvement demonstrated by the equation 92. However, the gain tracking across changes in time, temperature, process variations, and the like tends to be very accurate for similar devices 32 and, therefore, this causes the gain improvement demonstrated by the equation 92 to be quite accurate.

Figure 5:
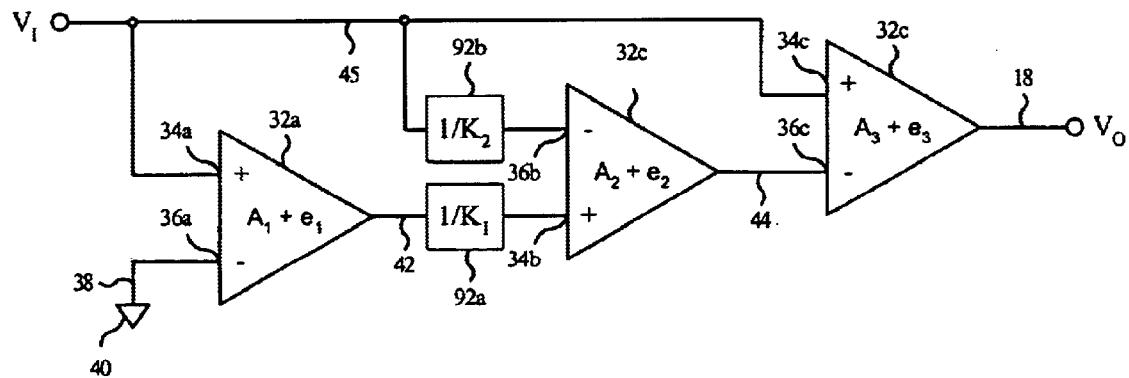
FIG. 5 is a schematic block diagram illustrating one embodiment of attenuators used in the circuit of FIG. 2 to enable adjustment of the output gain to a desired value.

Referring to FIG. 5, in certain embodiments, it may be desirable to provide a fixed-gain amplifier having very precise gain for gain values other than one. This may be achieved by attenuating various signals or voltages within the circuit 90.

For example, in one embodiment, an attenuator 92b may be placed in the path 43 to attenuate the signal 12 by a specified amount. Attenuating the signal 12 may have the effect of modifying the difference between the inputs 34b, 36b, thereby adjusting the value of the output signal 44. Likewise, other attenuators, such as an attenuator 92a, may be placed in other locations in the circuit 90, such as in the path 42, to attenuate the signal 42 by a desired amount. This may also have the effect of modifying the difference between the inputs 34b, 36b, thereby modifying the value of the output signal 44.

By adjusting the attenuators 92a, 92b, a desired output 18 may be achieved having a gain value other than 1 (e.g. 2, 4, 8, or the like). Since the attenuators may be designed to attenuate signals very precisely, the overall gain of the device may also be adjusted very precisely.

Figure 6:
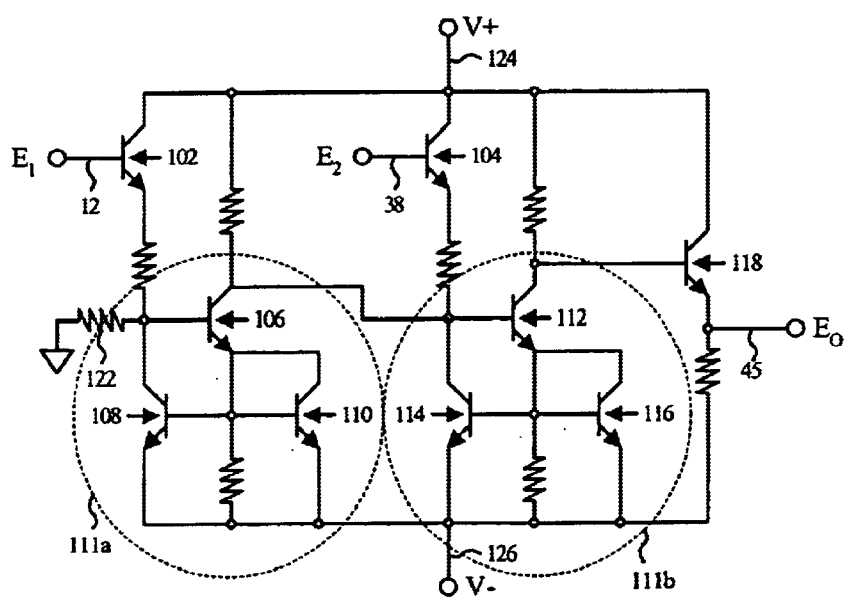

FIG. 6 shows one example of a fixed-gain amplifier 100 that may be used as amplifiers in the configurations previously described. The depicted fixed-gain amplifier 100 is based on a current mirror architecture. The depicted example is presented only by way of example and is not intended to limit the scope of the present invention. In fact, other amplifiers may exist that may provide suitable amplifiers within the previously described configuration such as the configuration depicted in FIG. 2.

The depicted fixed-gain amplifier 100 may provide a wide range of fixed gains, however, the depicted fixed-gain amplifier 100 preferably provides fixed gains within a range of 2 through 4. Emitter follower devices (transistors) 102, 104, are provided to increase the input impedance into the inputs 12, 38. The devices 102, 104 may also be used to buffer the depicted fixed-gain amplifier 100 from any input termination resistors that may be required to reduce noise. Current mirrors may be implemented by a first group of transistors 106, 108, 110, representing a first current mirror 111a, and a second group of transistors 112, 114, 116, representing a second current mirror 111b.

The device 116 may be scaled with respect to the device 114 to provide a desired input/output mirror ratio. An emitter follower device 118 may be used as an output buffer 118. The resistors 120, 122 operate in conjunction with the transistors 106, 108, 110 to provide the first current mirror 111a. As depicted, the first current mirror 111a and the second current mirror operate in a complementary manner to provide an output signal that is proportional to the difference of the two input signals. For more information on amplifiers that may be used with the present invention, one may refer to a paper entitled "A Wideband Integrated Circuit Amplifier for Fixed-gain Application" authored in 1996 by Donald T. Comer one of the inventors of the present application.

Figure 7:
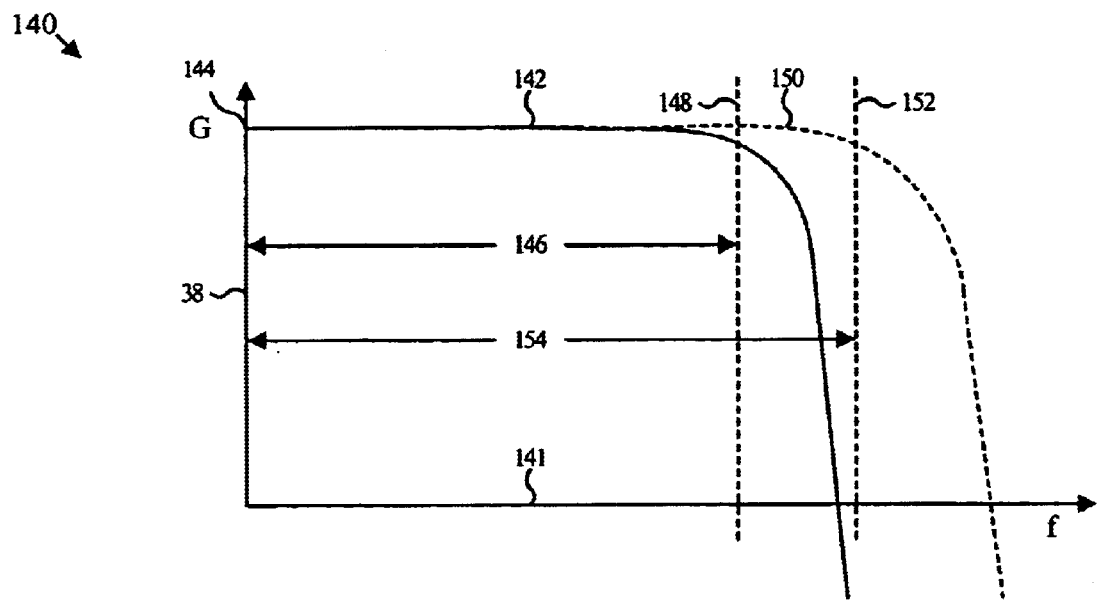

Referring to FIG. 7, while continuing to refer generally to FIG. 2, the configuration 30 illustrated in FIG. 2 has been disclosed in this specification as an apparatus and method for improving the gain accuracy over that achievable by any of the individual amplifiers 32. Nevertheless, the apparatus and method 30 may also provide improved bandwidth characteristics.

For example, an individual amplifier 32 within the circuit 30 may exhibit bandwidth characteristics represented by a first curve 142 on a graph 140. A horizontal axis 141 may be used to represent a frequency value and a vertical axis 143 may be used to represent a gain value. The curve 142 may represent a relatively constant gain over a given frequency range 146. However, the curve 142 may drop off at a particular frequency 148 due to an amplifier's device characteristics.

The method and configuration disclosed in FIG. 2 may actually improve the bandwidth characteristics of the device 30 as a whole over the bandwidth characteristics of any of the individual devices 32. A second curve 150 may be used to illustrate the improved bandwidth characteristics of the device 30. The curve 150 may drop off at an improved frequency 152, thereby providing an improved bandwidth 154.

This behavior may be explained, in part, by the unique configuration 30 of the amplifiers 32. Because each of the amplifiers 32a, 32b, 32c may impose a delay on respective signals passing therethrough, a signal 44 may arrive at the device 32c later than the signal 45. As a result a "subtraction" portion 44 of the total output 18 may arrive at the output 18 later than the applied signal 12, 45. This may cause some peaking in the frequency response. However, the peaking may be controlled. Thus, the configuration 30 may, in addition to improving gain precision, increase the bandwidth and speed of the amplifier 30 over that of any of the individual amplifiers 32. In certain embodiments, the bandwidth improvement may lie within the range of 20 to 50%.

Referring to FIG. 8, while continuing to refer generally to FIG. 2, as has been previously mentioned, the present invention may use individual amplifiers that are relatively fast and have relatively accurate gain. This may be accomplished by selecting amplifiers, such as open loop amplifiers that achieve gain precision using device matching, current mirrors, and the like, and avoiding compensatory circuitry (e.g. feedback) that may inhibit system performance and bandwidth.

For example, as depicted, an amplifier 32 includes various internal stages 174, 176, 178 in a cascade arrangement. The internal stages 174, 176, 178 may or may not use some minor loop feedback 180, 182 to achieve device stability or other device characteristics in that minor loop feedback typically does not degrade the response characteristics of the internal stages 174, 176, 178. Preferably, however, the amplifier 32 is not configured to use major loop feedback. Major loop feedback may be defined as feedback that connects an amplifier's output 168 back to an input 170, 172 with or without using arbitrarily selectable resistors 164, 166. However, an amplifier may still use minor loop feedback to achieve device precision, while retaining desirable response characteristics.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An apparatus for providing precise gain using less precise amplifiers, the apparatus comprising:
   a plurality of cascaded amplifiers, each amplifier thereof having a positive input, a negative input, and a gain error, the plurality of amplifiers configured to alternate reception of an input signal between the positive input and the negative input of adjacently cascaded amplifiers; and
   the plurality of amplifiers further configured to provide an overall output signal that is proportional to a difference between the input signal and a reference signal, the overall output signal having a gain error that is less than the gain error of each individual amplifier of the plurality of cascaded amplifiers.

2. The apparatus of claim 1, wherein the plurality of cascaded amplifiers comprises:
   a first amplifier configured to provide a first output signal that is proportional to a difference between the input signal and the reference signal;
   a second amplifier configured to provide a second output signal that is proportional to a difference between the first output signal and the input signal;
   a third amplifier configured to provide a third output signal that is proportional to a difference between the input signal and the second output signal; and
   wherein the third output signal is the overall output signal.

3. The apparatus of claim 1, wherein at least one of the plurality of amplifiers is a fixed-gain amplifier.

4. The apparatus of claim 1, wherein at least one of the plurality of amplifiers is an open-loop amplifier.

5. The apparatus of claim 1, wherein at least one of the plurality of amplifiers achieves gain accuracy by device matching.

6. The apparatus of claim 1, wherein the gain error of each amplifier is substantially equal and the overall gain error is substantially proportional to two times the square of the gain error plus the cube of the gain error.

7. The apparatus of claim 6, wherein a gain provided by each amplifier is substantially equal to one, wherein the apparatus further comprises signal attenuators connected such an overall gain is substantially other than one.

8. A method for providing precise gain using less precise amplifiers, the method comprising:
   providing a plurality of cascaded amplifiers, each amplifier thereof having a positive input, a negative input, and a gain error;
   receiving an input signal on inputs of alternating polarity for adjacent amplifiers within the plurality of cascaded amplifiers; and
   providing an overall output signal that is proportional to a difference between the input signal and a reference signal, the overall output signal having a gain error that is less than the gain error of each individual amplifier of the plurality of cascaded amplifiers.

9. The method of claim 8, wherein providing an overall gain comprises:
   producing a first output signal that is proportional to a difference between the input signal and the reference signal;

producing a second output signal that is proportional to a difference between the first output signal and the input signal;

producing a third output signal that is proportional to a difference between the device input signal and the second output signal; and wherein the third output signal is the overall output signal.

10. The method of claim 8, wherein producing the first, second, and third output signals is achieved without using negative feedback.

11. The method of claim 8, wherein at least one of the plurality of amplifiers is a fixed-gain amplifier.

12. The method of claim 8, wherein at least one of the plurality of amplifiers is an open-loop amplifier.

13. The method of claim 8, wherein at least one of the plurality of amplifiers achieves gain accuracy by device matching.

14. The method of claim 8, wherein the gain error of each amplifier is substantially equal and the overall gain error is substantially proportional to the square of the gain error of each amplifier.

15. The method of claim 8, wherein the gain error of each amplifier is substantially equal and the overall gain error is substantially proportional to the gain error of each amplifier raised to the fourth power.

16. The method of claim 8, wherein a gain provided by each amplifier is substantially equal to one, further comprising attenuating signals such that the overall gain is a value substantially other than one.

17. An apparatus for increasing the bandwidth of amplifiers, the apparatus comprising:

a plurality of cascaded amplifiers, each amplifier thereof having a positive input, a negative input, and a bandwidth, the plurality of amplifiers configured to alternate reception of an input signal between the positive input and the negative input of adjacently cascaded amplifiers; and the plurality of amplifiers further configured to provide an overall output signal that is proportional to a difference between the input signal and a reference signal, the overall output signal having a bandwidth that is greater than the bandwidth of each individual amplifier of the plurality of cascaded amplifiers.

18. The apparatus of claim 1, wherein the plurality of amplifiers comprises:

a first amplifier configured to provide a first output signal that is proportional to a difference between an input signal and a reference signal;

a second amplifier configured to provide a second output signal that is proportional to a difference between the first output signal and the input signal;

a third amplifier configured to provide a third output signal that is proportional to a difference between the input signal and the second output signal; and wherein the third output signal is the overall output signal.

19. A method for providing a wideband amplifier using amplifiers of lesser bandwidth, the method comprising:

providing a plurality of cascaded amplifiers, each amplifier thereof having a positive input, a negative input, and a bandwidth;

receiving an input signal on inputs of alternating polarity for adjacent amplifiers within the plurality of cascaded amplifiers; and providing an overall output signal that is proportional to a difference between the input signal and a reference signal, the overall output signal having a bandwidth that is greater than the bandwidth of each individual amplifier of the plurality of cascaded amplifiers.

20. The method of claim 19, further comprising:

producing a first output signal that is proportional to a difference between an input signal and a reference signal;

producing a second output signal that is proportional to a difference between the first output signal and the input signal;

producing a third output signal that is proportional to a difference to between the device input signal and the second output signal; and wherein the third output signal is the overall output signal.

21. An apparatus for providing precise gain and improved bandwidth using less precise amplifiers, the apparatus comprising:

a plurality of cascaded amplifiers, each amplifiers thereof having a positive input, a negative input, a gain error, and a bandwidth, the plurality of amplifiers configured to alternate reception of an input signal between the positive input and the negative input of adjacently cascaded amplifiers; and the plurality of amplifiers further configured to provide an overall output signal that is proportional to a difference between the input signal and a reference signal, the overall output signal having a gain error that is less than the gain error of each individual amplifier of the plurality of cascade amplifiers and a bandwidth that is greater than the bandwidth of each individual amplifier of the plurality of cascaded amplifiers.

22. A method for providing precise gain and improved bandwidth using less precise amplifiers, the method comprising:

providing a plurality of cascaded amplifiers, each amplifier thereof having a positive input, a negative input, a gain error, and bandwidth; receiving an input signal on inputs of alternating polarity for adjacent amplifiers within the plurality of cascaded amplifiers; and providing an overall output signal that is proportional to a difference between the input signal and a reference signal, the overall output signal having a gain error that is less than the gain error of each individual amplifier of the plurality of cascaded amplifiers and a bandwidth that is greater than the bandwidth of each individual amplifier of the plurality of cascaded amplifiers.

23. An apparatus for providing precise gain using less precise amplifiers, the apparatus comprising:

an output amplifier configured to provide gain to an input signal, the output amplifier having a gain error;

a gain compensation circuit configured to receive an input signal and provide a gain compensation signal that substantially compensates for the gain error of the output amplifier, wherein the gain compensation circuit comprises:

a first differential amplifier configured to amplify the input signal to produce an approximation of the output signal, and a second differential amplifier configured to compare the approximation to the input signal to produce the gain compensation signal; and the output amplifier further configured to substantially reduce the gain error using the gain compensation signal.

24. A method far providing precise gain to a signal, the method comprising:

providing an input signal;

providing gain to the input signal, the provided gain having a gain error;

providing a gain compensation signal that substantially compensates for the gain error, wherein providing the gain compensation signal comprises amplifying the input signal to produce an approximation of the output signal and comparing the approximation of the output signal to the input signal to produce the gain compensation signal; and compensating the provided gain using the gain compensation signal.

* * * * *